United States Patent
Gagnon et al.

(10) Patent No.: US 8,024,142 B1
(45) Date of Patent: Sep. 20, 2011

(54) METHOD AND SYSTEM FOR ANALYZING SIGNAL WAVEFORMS

(75) Inventors: Mathieu Gagnon, Verdun (CA); Jurgen Hissen, Port Moody (CA)

(73) Assignee: PMC-Sierra US, Inc., Sunnyvale, CA (US)

( * ) Notice: Subject to any disclaimer, the term of this patent is extended or adjusted under 35 U.S.C. 154(b) by 238 days.

(21) Appl. No.: 11/961,543

(22) Filed: Dec. 20, 2007

(51) Int. Cl.
*G06F 17/18* (2006.01)

(52) U.S. Cl. .......................................... 702/69
(58) Field of Classification Search ...................... 702/69
See application file for complete search history.

(56) References Cited

U.S. PATENT DOCUMENTS

| | | | |
|---|---|---|---|
| 4,386,526 A * | 6/1983 | Roeder | 73/587 |
| 6,463,109 B1 | 10/2002 | McCormack et al. | |
| 6,694,462 B1 | 2/2004 | Reiss et al. | |
| 6,920,402 B1 | 7/2005 | Liaw et al. | |
| 7,137,048 B2 | 11/2006 | Zerbe et al. | |
| 7,143,323 B2 | 11/2006 | Sweet | |
| 7,185,252 B2 | 2/2007 | Choi | |
| 7,194,365 B1 | 3/2007 | Sonntag | |
| 7,262,621 B1 | 8/2007 | Caffee et al. | |
| 2003/0169755 A1 * | 9/2003 | Ternovsky | 370/412 |
| 2004/0019458 A1 | 1/2004 | Jang | |

* cited by examiner

*Primary Examiner* — Tung S Lau
(74) *Attorney, Agent, or Firm* — Leslie A. Kinsman; Borden Ladner Gervais LLP

(57) ABSTRACT

A method and system for analyzing a signal waveform that comprises digitally sampling a signal at a periodic sampling interval, and accumulating a count of samples of the signal at a given logic level relative to a threshold value over a given period. The threshold value is stepped through a series of values while the accumulating of samples is repeated at a series of different clock offsets. The accumulated counts permit a statistical distribution of the signal waveform to be determined. A signal density can also be calculated by determining the difference between the count of adjacent samples at successive threshold values.

7 Claims, 7 Drawing Sheets

METHOD AND SYSTEM FOR ANALYZING SIGNAL WAVEFORMS

FIELD OF THE INVENTION

The present invention relates generally to characterizing digital communication circuits. More particularly, the present invention relates to analyzing received signal waveforms.

BACKGROUND OF THE INVENTION

Current communication circuits have a high level of integration and achieve high performance by minimizing parasitic effects. During both product characterization and normal product usage, it is often desired to observe signal waveforms on critical high-speed internal nodes. However, current integrated circuits cannot be directly probed internally without significantly altering the signal to be observed.

Internal characterization is a very important, time-consuming and expensive part of the complete design cycle. At the current design speeds, sampling the signal internally is very difficult and requires dedicated output pads with linear buffers. These elements require significant area and their design is difficult. Even if turned off in normal operation, their presence can cause detrimental effects that limit the bandwidth and require improved performance from the circuits ahead. The cost of high-speed test equipment is also substantial.

Most existing methods for indirectly probing internal nodes use dedicated circuits to apply time and voltage offsets to probe different parts of the waveform. FIG. 1 shows a typical prior art signal waveform analysis system. A transmitter 20 sends digital information to a receiver 22 through a transmission channel 24. The intent is to evaluate the waveform of the recovered signal 26. The signal 26 is sampled by a sampler 28 with a timing reference 30, derived from the incoming signal 26 through a clock recovery circuit 32, and further adjusted by a clock skew circuit 34. The voltage threshold 36 of the sampler 24 is controlled by a threshold control circuit 38. The output 40 of the sampler 28 is a digital signal that is compared with the expected pattern at a comparator 42. The number of discrepancies, or bit errors, is recorded in an error counter 44 for the duration of the test. The measurement is repeated with different combinations of clock skews, generated by clock skew circuit 34, and threshold values, generated by threshold control circuit 38. The representation of the number of errors as a function of both the clock skew and the threshold maps a 2-D representation of the signal during a clock cycle. This map represents the probability of bit errors as a function of clock skew and sampler threshold during the bit period.

A common way to represent a communication signal waveform is to plot its amplitude vs. the time elapsed from a fixed instant relative to the current bit period start. The graph resulting from showing many such waveforms collected over different bit periods is called an eye diagram. The bit error map described above has a shape similar to that of the eye diagram, as its probability distribution matches that of the signal traces around the "center opening" of the eye diagram.

Such previously known signal waveform analysis systems typically require a known pattern to be transmitted, in order to be able to compare the recovered signal with the expected value. This limits the application to systems where the transmitter is fully controllable, and can send one of the patterns that can be detected at the output. In a practical application, the data transmitted can be difficult to control and programming this configuration can require lengthy setup procedures. The analysis of critical internal node signal waveforms is also helpful to identify problems that arise when a specific pattern is transmitted. However, if the specific pattern is not one of the pre-defined test patterns, previously known analysis systems are not useful for this purpose.

SUMMARY OF THE INVENTION

In a first aspect, the present invention provides a method of analyzing a signal waveform. The method comprises digitally sampling a signal at a periodic sampling interval; accumulating a count of samples of the signal at a logic level relative to a threshold value over a given period; stepping the threshold value through a series of values and repeating the steps of digitally sampling and accumulating samples; and modifying the skew of the periodic sampling interval and repeating the steps of digitally sampling, accumulating the count of samples and stepping the threshold to determine a statistical distribution of the signal waveform. A signal density can also be calculated by determining the difference between the count of adjacent samples at successive threshold values for each sampling offset skew.

According to a further aspect, there is provided a system for analyzing a signal waveform. The system comprises a threshold control circuit to step a threshold value through a series of values; a sampler to sample a signal at a periodic sampling interval; a clock skew circuit to apply a clock offset to a clock signal to determine the periodic sampling interval and to step the periodic sampling interval through series of values; and an accumulator to accumulate, over a given period, a count of samples of the signal at a logic level relative to each of the series of threshold values, and at each of the series of periodic sampling intervals, to provide a statistical distribution of the signal waveform. A synchronization circuit controls the accumulator to accumulate a count of samples for the given period, and a clock recovery circuit recovers the clock signal.

In an embodiment of the system, a reference sampler provides reference samples sampled at a reference threshold and according to the clock signal, and a reference accumulator accumulates a count of the reference samples. The system can also include multiple sampler circuits operating sequentially, or multi-level sampler circuits simultaneously sampling at a plurality of threshold values.

Other aspects and features of the present invention will become apparent to those ordinarily skilled in the art upon review of the following description of specific embodiments of the invention in conjunction with the accompanying figures.

BRIEF DESCRIPTION OF THE DRAWINGS

Embodiments of the present invention will now be described, by way of example only, with reference to the attached Figures, wherein.

DETAILED DESCRIPTION

Figure 1:
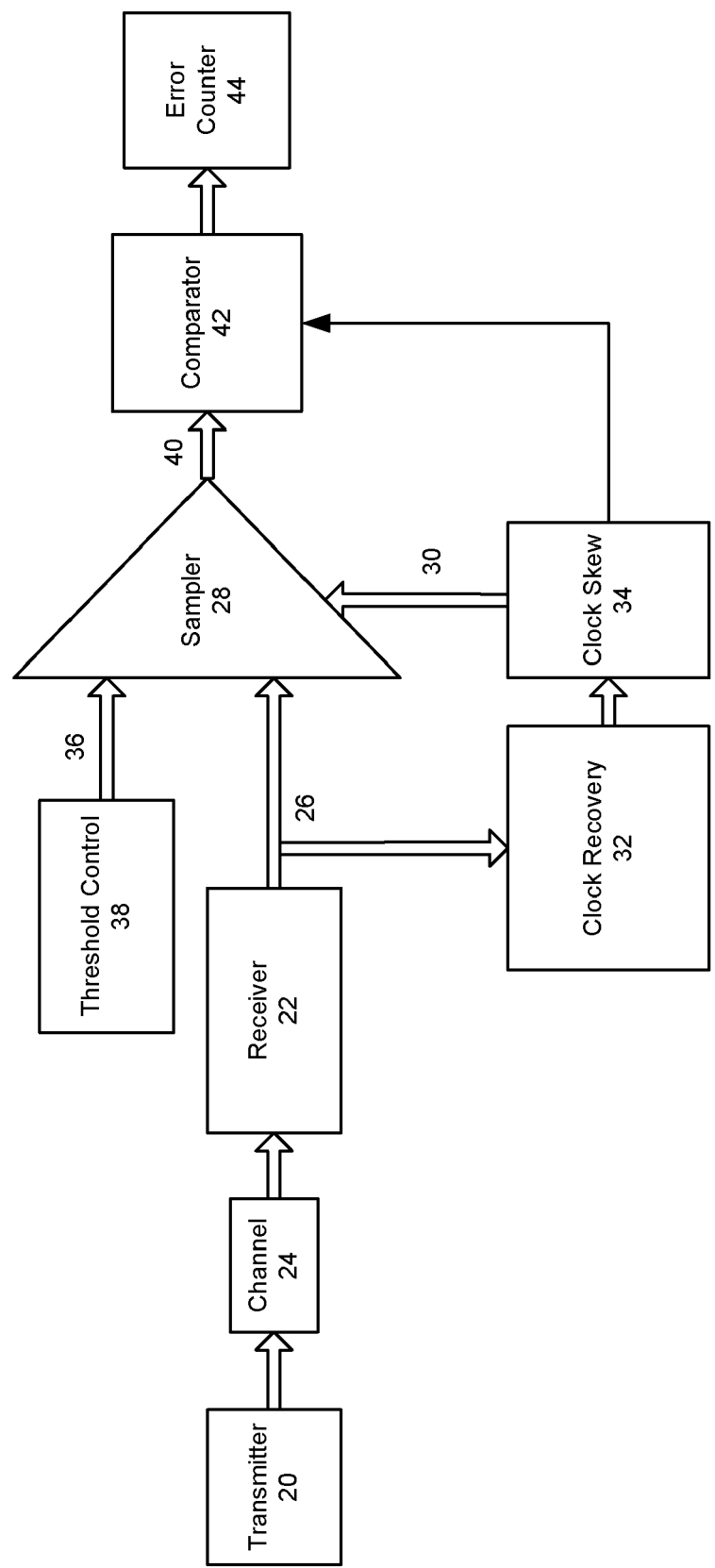
FIG. 1 is a prior art signal waveform analysis system.

Generally, the present invention provides a method and system for analyzing signal waveforms. The system can be integrated directly onto the device or chip, and can take advantage of existing on-chip components, such as samplers, comparators, and clock recovery circuits. The present system evaluates a signal waveform based upon its statistical distribution. It uses the pattern balance information contained in a digital signal, or the periodic nature of a signal to determine the cumulative statistical distribution of the signal, and it uses the difference between consecutive cumulative statistical distributions to evaluate the statistical density of the signal. A pre-defined bit sequence is not required.

The present invention provides both internal characterization and evaluation of the performance in high-speed communication systems. Existing circuitry is re-used and the extra functionality is pushed away from the sensitive high-speed parts of the communication system. For example, the extra circuits can be placed after the digital sample's frequency is reduced by digital means (e.g. after a serial-to-parallel interface). The overhead circuitry required to implement this functionality is thus small, easy to design, and does not interfere with the sensitive high-frequency nodes that are to be probed.

In most digital communication systems, the bits sent have an equal probability of being logic 1's or logic 0's over a sufficiently long period of time. This property ensures that an undistorted and noiseless signal sampled with a threshold selected to be between the logic 1 and logic 0 levels, at the appropriate time between the transitions, will return a number of 1's within a known range over a given period of time. Those skilled in the art will recognize that this range is determined by constraints imposed by the communication protocol used. Furthermore, by starting to count the number of bits based upon specific patterns meant for bit alignment, this range can sometimes be reduced.

For analyzing digital signals, the present system and method takes advantage of the limited range in the normal counts of logic 1's or 0's over a given period of time. If the signal is sampled at a threshold and instant within the bit period where the probability of getting a 0 or a 1 is equal, the final count will indicate a proportion of 1's close to 50%. When the threshold or sampling time is modified such that some bits that would normally sample as a logic 1 get sampled as a logic 0, the ratio of logic 1's will decrease below 50%. Thus, the expected distribution of 1's or 0's will vary as the sampling threshold and/or sampling instant gets closer to the location of the trace within the traces of the waveform eye diagram. The variation of the distribution of sampled 1's and 0's can then be used to deduce the signal waveform distribution over voltage and time skew relative to the bit period.

When sampling periodic waveforms repeatedly at a given instant in their period, the probability of getting a 1 will change as the sampler threshold is changed from well below the trace (where the probability of 1's will be close to 100%), to the average trace location (where the probability of 1's will be close to 50% due to noise), to well above the trace location (where the probability of 1's will be close to 0%). Thus, observed changes in the statistical distribution of a signal over the sampling voltage can be used to determine the distribution of the signal at different time instants within the period.

Figure 2:
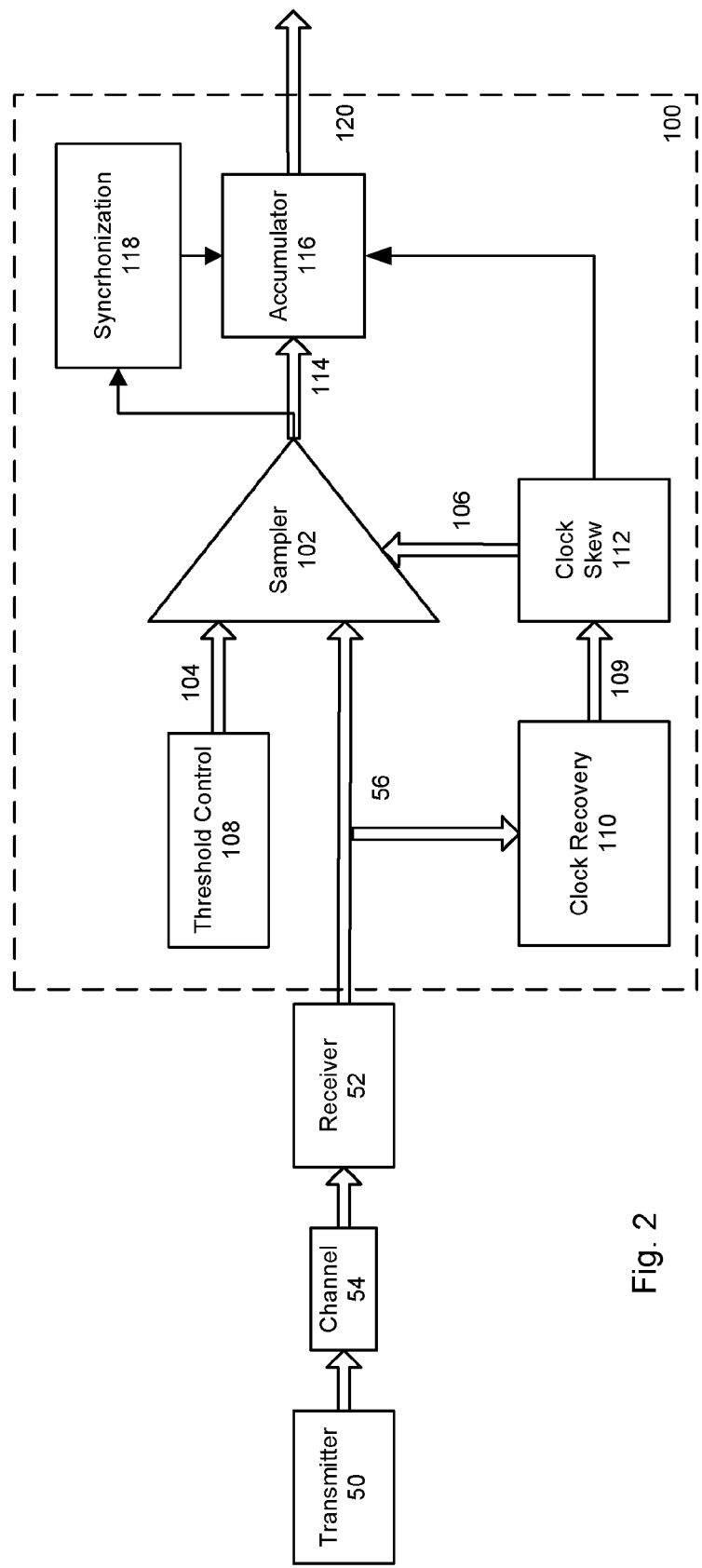
FIG. 2 is an embodiment of the system according to the present invention.

FIG. 2 shows a system 100 for analyzing signal waveforms according to an embodiment of the present invention. A transmitter 50 sends digital information to a receiver 52 over a transmission channel 54. The waveform of the received signal 56 is then analyzed by system 100. The incoming signal 56 is sampled by a sampler 102, at different thresholds 104 and sampling instants, relative to the center of the bit period. The voltage threshold 104 is controlled by a threshold control circuit 108. The sampling period is determined by a clock signal 109 recovered by a conventional clock recovery circuit 110, which is then offset by a clock skew circuit 112 to provide a reference clock signal 106. The clock recovery circuit 110 produces a recovered clock 109 aligned with the average center of the input signal bits. The sampler 102 compares the value of the input signal with the voltage threshold and outputs the result of the comparison at the beginning of every cycle of the reference clock signal. In a preferred embodiment, both the threshold control circuit 108 and the clock offset circuit 112 are controllable or programmable, to permit the voltage threshold 104 and the reference clock signal 106 to be swept through a series of values. The sampler 102 produces a digital output 114 that indicates whether the signal 56 is above (logic 1) or below (logic 0) the threshold value 104 at a given sampling instant 106.

The output of the sampler 102 is a digital signal that represents whether the input signal was below or above the threshold at the beginning of the last sampling clock cycle. The value of this signal is digitally summed with previous values in an accumulator 116. In other words, the number of sampled 1's (or alternately 0's) output by the sampler 102 in a given duration of time at a given clock offset is counted by the accumulator 116. The time duration (i.e. starting instants and stopping instants) is controlled by a synchronization circuit 118. The synchronization circuit 118 can, for example, count a pre-determined number of bits or be synchronized with the incoming pattern to reduce the possible range of variation of the final count.

The final output 120 of the accumulator 116 is the count of the number of bits whose voltage was above (or below) the threshold value at the sampling instants, after a pre-defined number of bits is sampled. Those skilled in the art will recognize that there are many ways to have the accumulator 116 output this value. The synchronization circuit 118 can, for example, reset the accumulator 116 when the count is desired to start, and output the value of the accumulator when the desired number of bits has been received. It can also output the value of a continuously running accumulator both at the initial and final instants. In this case, the number of bits counted during the period is calculated from the difference between the final and initial accumulator values.

Figure 3:
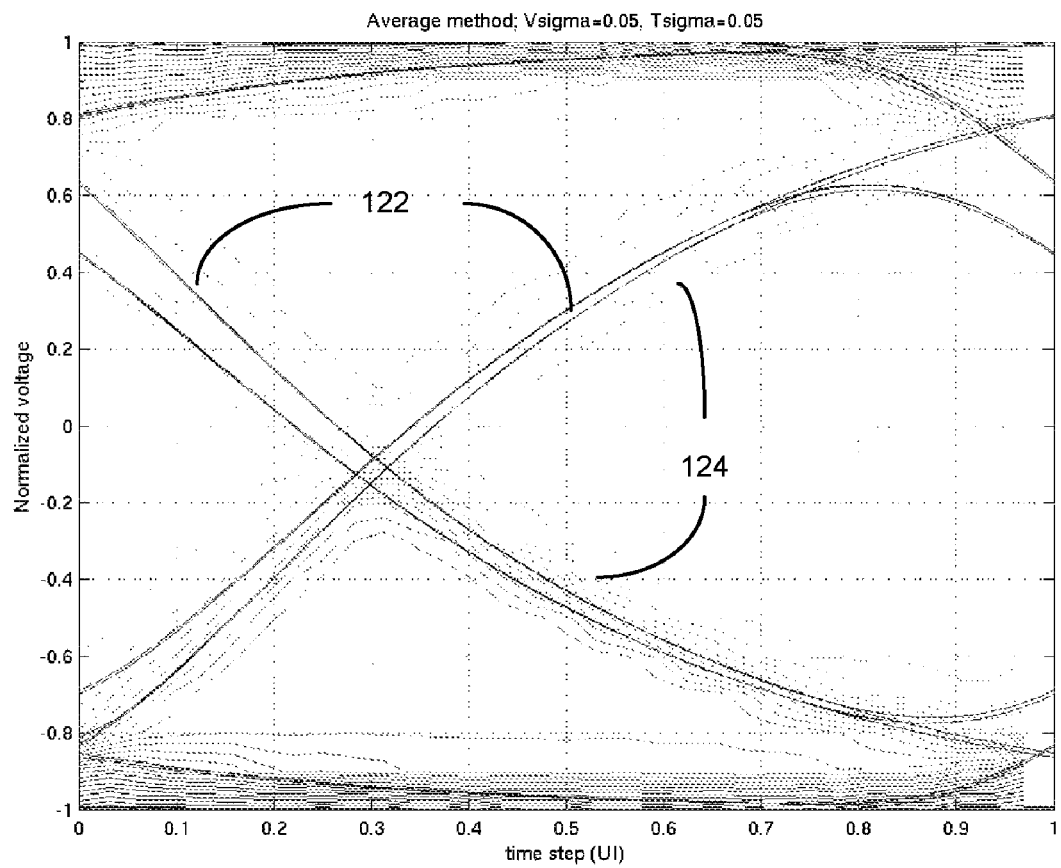
FIG. 3 is a plot of a signal waveform.

By recording the accumulation of 1's or 0's, as determined by the output 120 of accumulator 116, for equal periods of time over a range of thresholds 104 and clock skews 108, a 2-D map can be plotted. This map represents the probability that the incoming signal 56 is above the current threshold voltage at a given sampling instant within the bit period. An example of such a map is shown in FIG. 3. The bold lines 122 are representations of the eye diagram for an incoming signal without noise, and are added merely for the convenience of the reader, and to provide a reference to the incoming signal. Lines 122 are not generated by the system or method of the present invention. The contour lines 124 are generated from the output 120 of the accumulator 116, that is, the final values of the accumulator 116 at the end of the predetermined accumulation periods, collected over different sampler thresholds and clock skews. Increasing normalized clock skews are represented on the x-axis of the plot, while increasing thresholds are represented on the y-axis. Each contour line 124 links points of equal final values of the accumulator 116.

As can be seen, the contour lines 124 provide a good approximation of the eye diagram. The difference in shape between the lines 122 and the contour lines 124 can be explained by three factors: random noise is present in the true incoming signal 56; the variation of the threshold voltage and clock skew is performed in discrete steps (i.e. is discontinuous); and uncertainty introduced by variation in the number of logic 1's and 0's received during a given period of time, as determined by the specific communication protocol being used.

As described above, the maximal variation in the expected number of 1's or 0's over the period of time of the measurement can be bounded according to the protocol being used. The synchronization circuit 118 can also exploit specific properties of the incoming signal to synchronize the starting time of the accumulation, and its duration, so that this variation is minimized. The total number of bits accumulated, which corresponds to the time allowed for each accumulation, will usually determine the precision of the test. Since the variation of expected 1's or 0's is a fixed number, counting more bits will improve the precision.

In some protocols, if the output signal becomes too distorted for the synchronization circuit 118 to recognize it, a previously determined starting point can be used to adjust the start of the accumulation time. For example, in 8b10b protocols, the variation between the number of 1's and 0's is guaranteed to be either +1, 0 or −1, if the accumulation starts at the beginning of any 10-bit byte. When the location of the start of such a byte is determined from a previous run and the clock recovery is kept running, it is sufficient for the synchronization circuit 118 to start the next accumulation period any 10-bit multiple away from this known byte start to guarantee the same maximal mismatch of ±1 between the expected number of logic 1's or 0's received. Other characteristics of the signals can also be exploited to reduce this variation. Again, this is specific to the protocol being used.

As noted above, the output 120 of accumulator 116 for a given duration provides a number that is on average proportional to the probability that the recovered signal is above the threshold at a given sampling instant and sampling period. This can be explained by reference to the following equation:

$$X(\text{threshold}, \text{skew}) = P(\text{signal}(\text{skew} + n*\text{period}) > \text{threshold}) * N \quad \text{Eq.1}$$

for n=0 ... N−1; where:
- X(threshold, skew) is the expected output matrix as a function of the sampler threshold voltage and clock skew;
- P(event) denotes the probability of occurrence of "event";
- signal(time) is the incoming signal amplitude as a function of time;
- skew is the applied clock skew relative to the recovered clock (generated by clock recovery circuit 110 and clock skew circuit 112);
- period is the bit period duration;
- threshold is the sampler threshold as generated by threshold control circuit 108; and
- N is the total number of bits sampled at a given threshold and skew setting.

An estimation of X (threshold, skew), termed x(threshold, skew), is given by the value of the accumulator 116 after receiving N bits, with the appropriate thresholds and clock skews generated by circuits 108 and 112.

The estimation x(threshold, skew) can then be used to determine the probability that the signal lies within two consecutive threshold voltages. That is:

$$Z(\text{threshold}, \text{skew}) = P(\text{signal}(\text{skew} + n*\text{period}) > \text{threshold}) \text{ AND signal}(\text{skew} + n*\text{period}) \leq \text{threshold} + dV) * N \quad \text{Eq.2}$$

for n=0 ... N−1; where, in addition to the previously defined parameters:
- Z (threshold, skew) is the expected output matrix as a function of the sampler threshold voltage and clock skew; and
- dV is the voltage difference between two adjacent threshold settings.

Figure 4:
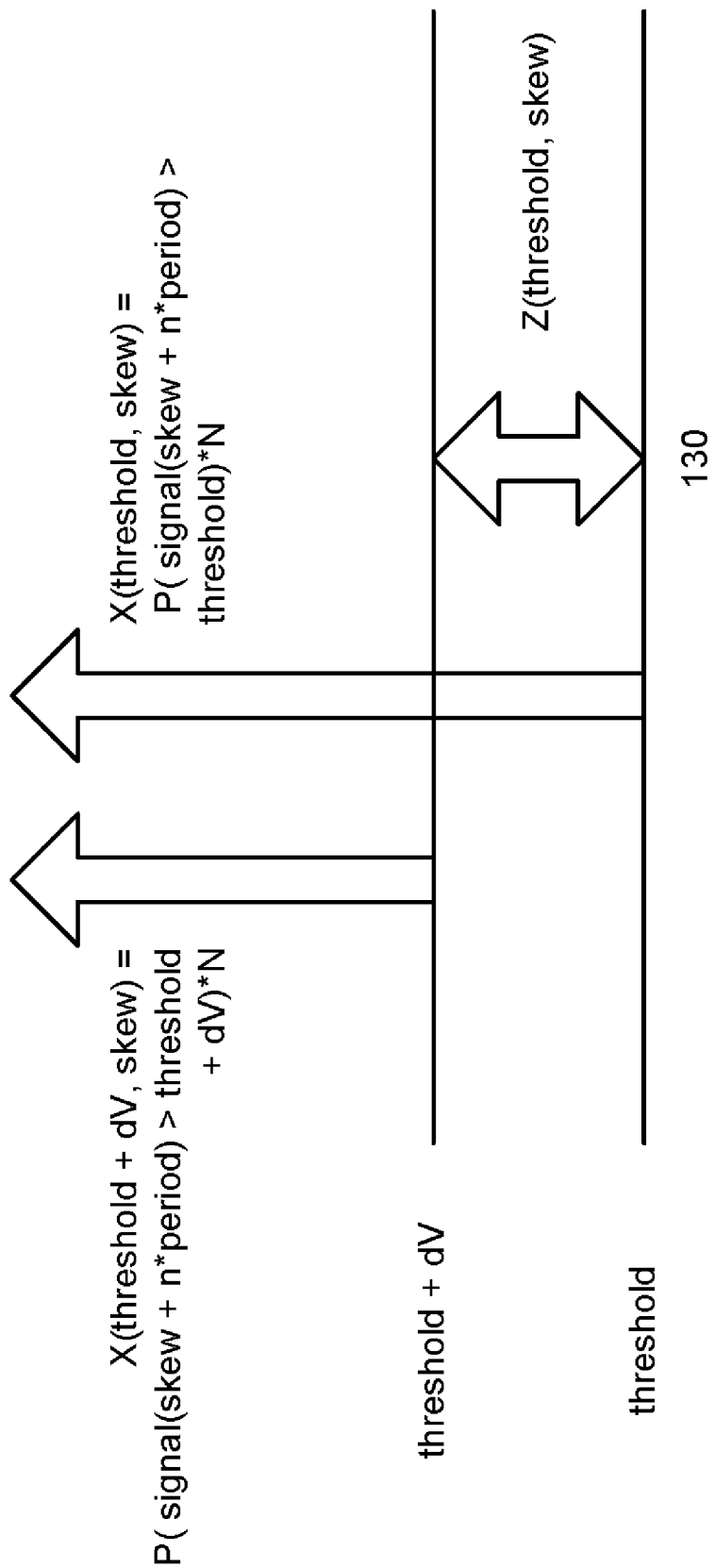
FIG. 4 shows the calculation of z(threshold, skew)

To estimate the Z matrix, one can take the difference between the results at two adjacent voltage thresholds collected at the same clock skew. This is illustrated in FIG. 4. The difference 130 is clearly the probability that a signal sampled at that instant within the bit period lies between the two successive thresholds. This is expressed formally as:

$$z(\text{threshold}, \text{skew}) = x(\text{threshold}, \text{skew}) - x(\text{threshold} + dV, \text{skew}) \quad \text{Eq.3}$$

Thus, by calculating the difference between sampled bits accumulated at adjacent threshold settings, for a given clock skew, the probability that the signal is between a given threshold and (threshold+dV) at that instant can be derived. This provides a discrete approximation of the signal density over voltage and time.

Figure 5:
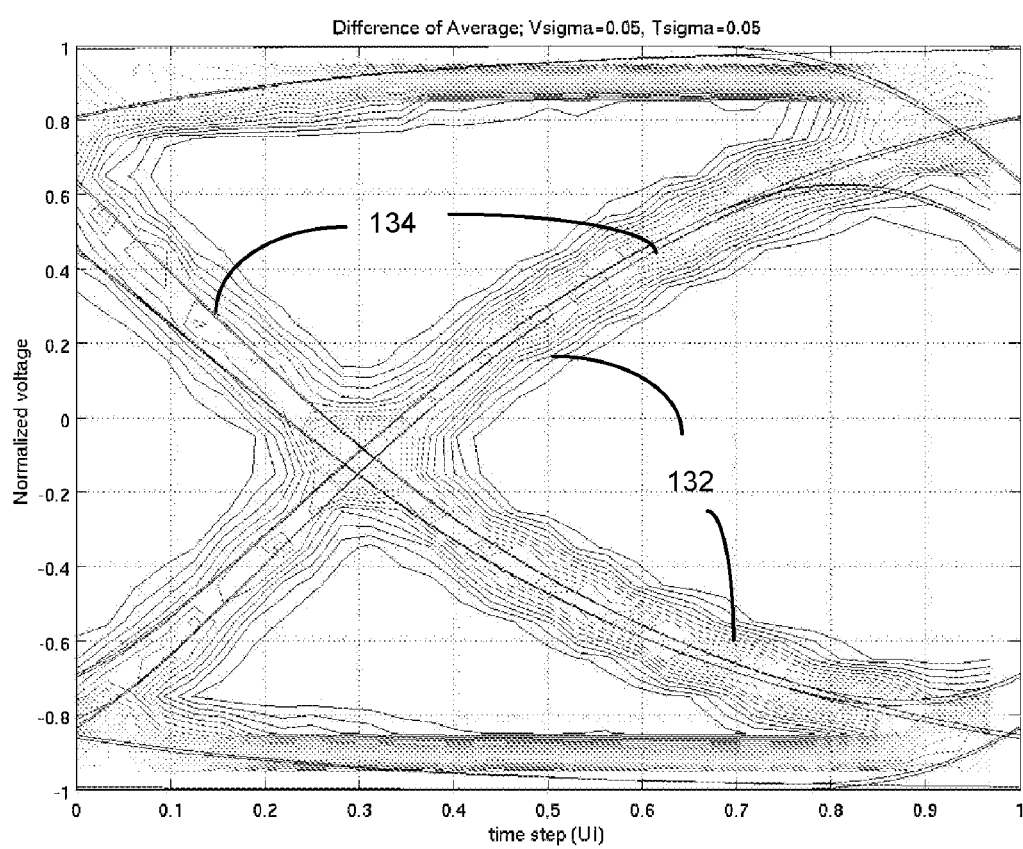
FIG. 5 is a plot of z(threshold, skew)

A plot of the resulting matrix z(threshold, skew) can be seen in FIG. 5. Assuming a constant dV throughout the threshold values, the contour lines 132 clearly show areas where the signal has the most chance of being found. These correspond to the average trace of the signal over the bit period 134, which have been added to this plot for reference. Those skilled in the art will recognize that the eye diagram, at a given probability level, can be directly derived from the contour lines 132. It should be noted that only a fraction of the horizontal or vertical extents of the graphs need to be sampled, and the results within those bounds will still be valid.

Figure 6:
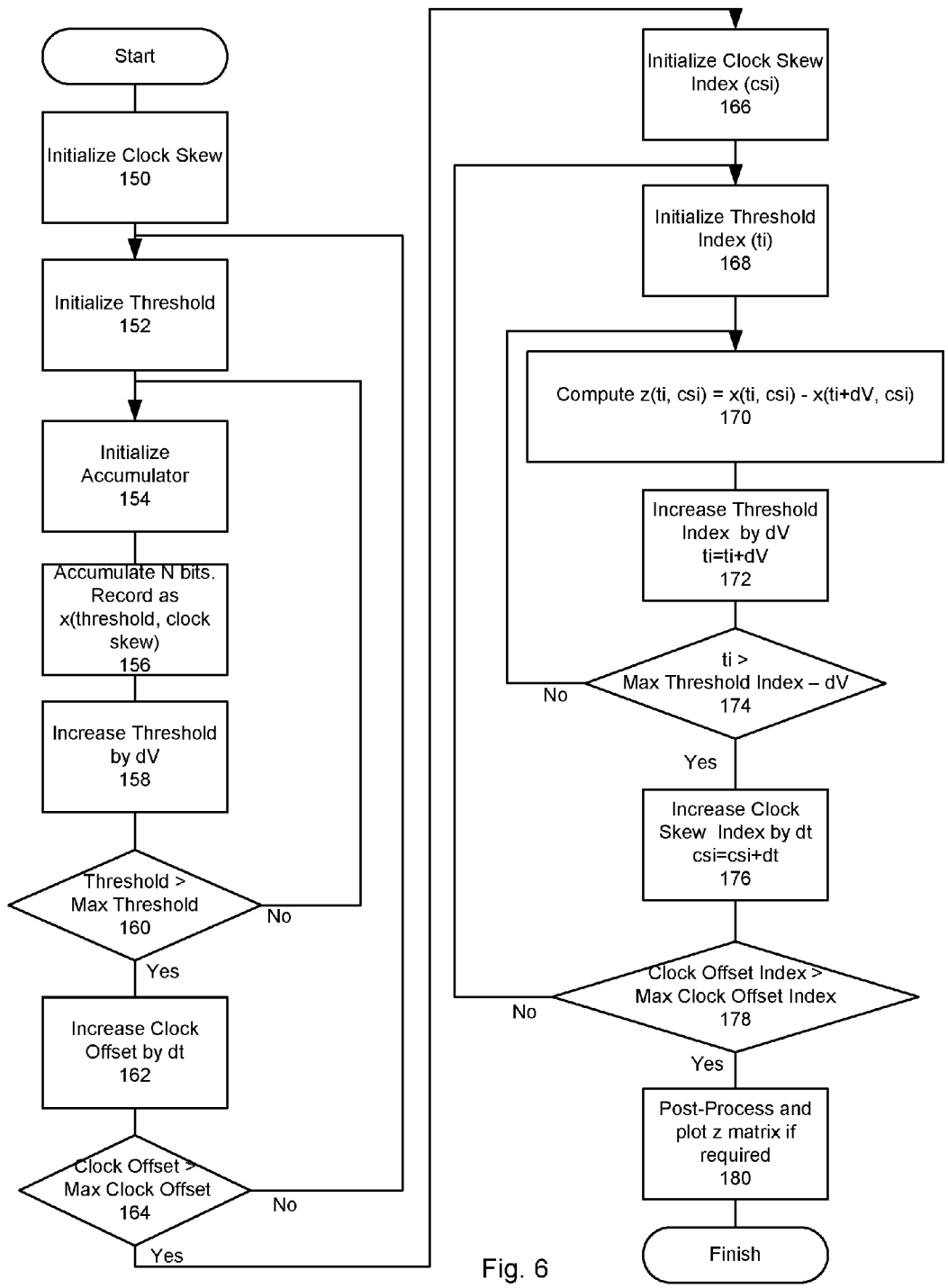
FIG. 6 is a flowchart of an embodiment of the method of the present invention.

FIG. 6 is a flowchart of the method of determining signal density over voltage and time, as described above. The method begins with initialization of the clock skew circuit, threshold control circuit to initial values and initialization of the accumulator to zero (steps 150, 152 and 154). The value of x(threshold, skew) is then recorded for N bits, as determined by the synchronization circuit (step 156). As shown by the two nested loops, the threshold voltage is then increased by dV (step 158), and the method again proceeds through steps 154, 156 and 158 until the maximum threshold value is reached (step 160). The clock offset is then increased by dt (step 162), and the threshold voltage is again stepped through its desired values. The loops end once the maximum clock offset has been reached (step 164). A clock skew index csi and threshold index ti are then initialized (steps 166 and 168), and each value of the z matrix is then computed as $$z(ti, csi) = x(ti, csi) - x(ti + dV, csi)$$

by increasing ti by dV and csi by dt, as shown by the nested loops shown at steps 168, 170, 172, 174, 176 and 178. The resulting z matrix can then be post-processed and plotted (step 180), if desired, to arrive at a plot as shown in FIG. 5.

Figure 7:
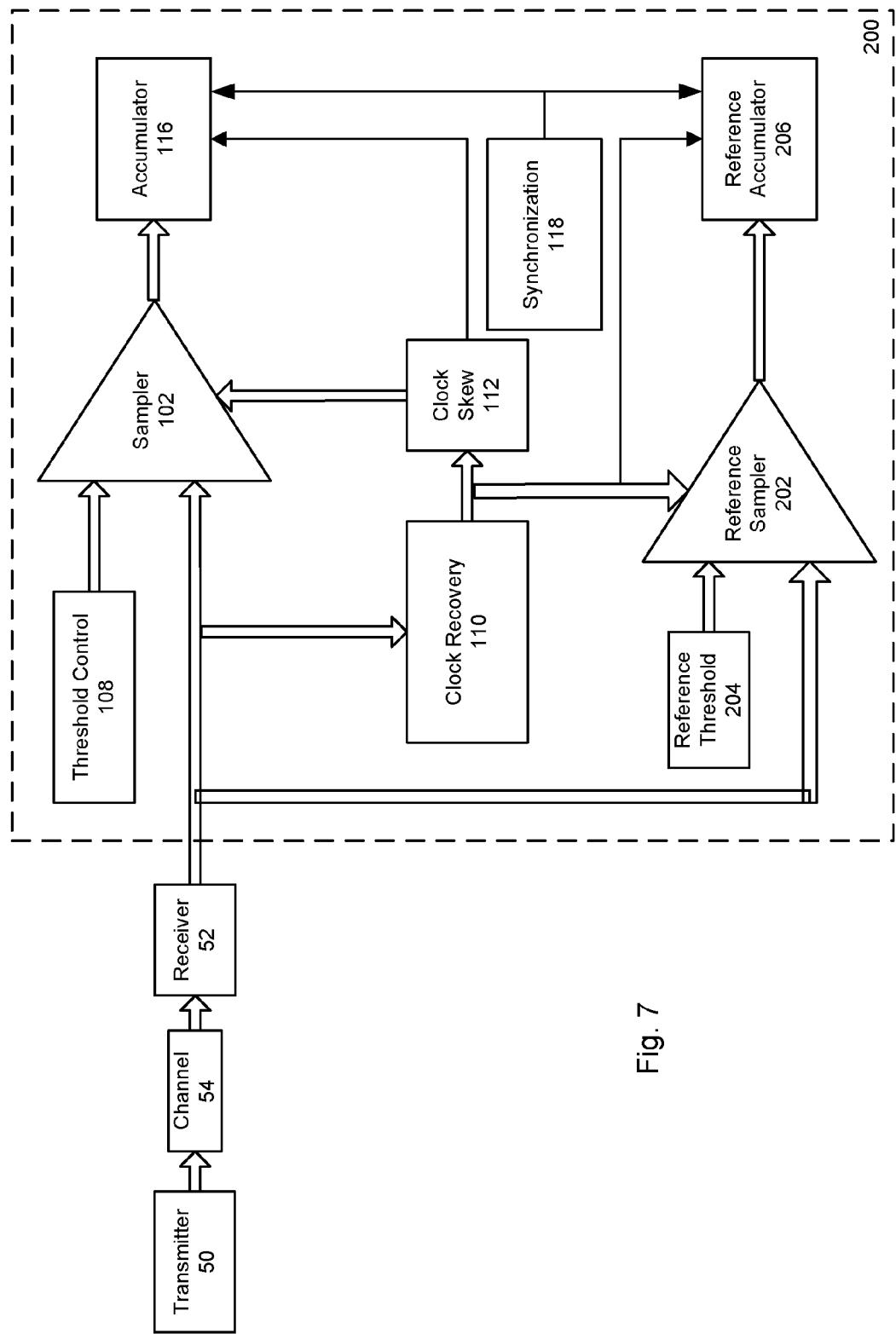
FIG. 7 is a further embodiment of the system according to the present invention.

FIG. 7 illustrates a further embodiment of the signal waveform analysis system 200. This embodiment is particularly applicable where the number of logic 1's or 0's received is not guaranteed to be within a given range. Common elements between this embodiment and the embodiment of FIG. 2 are similarly numbered, and their operation is not described again. In this case, a reference sampler 202 samples the signal in the center of the bit period, using an optimal clock reference from the clock recovery circuit 110 and a centered threshold provided by a reference threshold circuit 204. A reference accumulator 206 is used to count the true expected number of 1's or 0's received. The reference accumulator 206 is also controlled by the synchronization circuit 118. The count received from the reference accumulator 206 permits a standardized probability to be computed, instead of just counting the number of 1's or 0's. As the number of accumulated bits becomes large, this standardized probability effectively becomes a good estimator of the probability that the signal is above the current threshold.

Referring to Eq. 1 above, $$X'(\text{threshold},\text{skew})=P(\text{signal}(\text{skew}+n*\text{period})>\text{threshold}) \quad \text{Eq.4}$$

for n=0 ... N−1
An estimate of X' (threshold, skew), termed x' (threshold, skew) can then be estimated as:

$$x'(\text{threshold},\text{skew})=(\text{accumulator count})/(\text{reference accumulator count}) \quad \text{Eq.5}$$

x' (threshold, skew) can then be used instead of x(threshold, skew) in Eq. 3 to derive the Z matrix.

It is also possible to evaluate the waveform of periodic sequences of bits (i.e. one that repeats over time) using the present system. Those skilled in the art will recognize that certain sequences, such as pulses or steps, can give important information about a system's characteristics. Periodic approximations of those sequences can be easily created. To analyze the signal waveform of such sequences, the system of FIG. 2 can be used. However, the accumulator 116 only accumulates sampler results at a pre-defined rate. Specifically, it can be used to record one bit out of M, where M is the number of bit periods in the repetitive sequence. The threshold is stepped as before and the output of the sampler 102 analyzed. However, the analysis is now based upon the fact that a noiseless periodic signal, repeatedly sampled at a fixed instant relative to its period beginning, will produce a constant result. This result will be always logic 1 when the threshold is lower than the signal, and logic 0 when the threshold is higher than the signal. For a noisy periodic signal, the repetition of this measurement over different sampling thresholds over a large number of periods will still show variations in the final accumulated sampled values. These variations can be linked to the average value of the signal at the sampling instants and to the amount of superposed noise. The sampling and accumulation steps are run with different sampler thresholds and clock skews as described above, but are further repeated for every bit offset of the M bits of the repetitive sequence. This is equivalent to extending the clock skew range over M bits. Whether this is controlled by the clock skew circuit or by some modification of the synchronization and/or accumulator circuit is a matter of implementation.

As will be apparent to those of skill in the art, this method can also be applied to non-periodic digital signals for which the reference clock frequency is faster than the incoming digital signal bit rate by an integer multiple. In this case, it can be seen as a way to extend the clock skew over more than one bit period.

This method can also be applied to a periodic, non-digital signal (i.e. an analog signal). In this case, the sampling clock will be generated from a fixed time base rather than from the input signal itself. The input signal period must be an integer multiple of the time base period.

As will be apparent to those of skill in the art, the present invention can be applied to half-rate or similar architectures. In this case, multiple samplers in parallel can each operate on different data samples, in sequence. The results of the sequential samplers can be combined, either in common accumulators, or through the summation of distinct accumulators. Similarly, multi-level samplers can be used, where each operates at the same time, but each with a different threshold value. Analog-to-digital converters are examples of such multi-level samplers.

As will be appreciated by those of skill in the art, the present system and method for analyzing a signal waveform provide many advantages over previously known systems and methods. The analysis circuitry can be included on the integrated chip, and can use many circuits and components normally required in communication systems, such as samplers, threshold control circuitry, and clock recovery circuitry.

The present invention can be applied to most high-speed communication systems. It can also be used to probe high-speed internal nodes, especially for microelectronic systems. The method is suitable for use in integrated circuit with minimal impact on the sensitive high-speed node to be probed. The system is also able to analyze signals of arbitrary information content—the receiver does not need to know in advance the content of the signal. As will be further appreciated, this permits assessment of the performance in final communication system in real-world situations. The present system and method can be used to identify problem causes in installed systems, as well as to predict quickly the noise immunity of such systems. The effect of various settings or configurations can be easily monitored and compared.

In the preceding description, for purposes of explanation, numerous details are set forth in order to provide a thorough understanding of the embodiments of the invention. However, it will be apparent to one skilled in the art that these specific details are not required in order to practice the invention. In other instances, well-known electrical structures and circuits are shown in block diagram form in order not to obscure the invention. For example, specific details are not provided as to whether the embodiments of the invention described herein are implemented as a software routine, hardware circuit, firmware, or a combination thereof.

The above-described embodiments of the invention are intended to be examples only. Alterations, modifications and variations can be effected to the particular embodiments by those of skill in the art without departing from the scope of the invention, which is defined solely by the claims appended hereto.

What is claimed is:

1. A method of analyzing a signal waveform at a receiver, comprising:
    digitally-sampling the signal waveform amplitude at a periodic sampling interval to provide sampled values of the signal waveform
    accumulating a count of the sampled values having a given logic level relative to a threshold value over a given period;
    stepping the threshold value through a series of values and repeating the steps of digitally sampling the signal waveform amplitude and accumulating a count of the sampled values; and
    modifying a skew of the periodic sampling interval and repeating the steps of digitally sampling the signal waveform amplitude at the periodic sampling interval, accumulating a count of the sampled values and stepping the threshold value through a series of values to determine a statistical distribution of the signal waveform received at the receiver.

2. The method according to claim 1, wherein the given logic level is '1'.

3. The method according to claim 1, wherein the given logic level is '0'.

4. The method according to claim 1, further comprising determining the difference between the count of adjacent sampled values at successive threshold values to determine a signal density distribution.

5. The method according to claim 1, wherein the step of accumulating comprises accumulating every Mth sample, and the method is performed M times while shifting the sampled values accumulated.

6. The method according to claim 5, wherein the signal waveform is a periodic signal waveform.

7. The method according to claim 5, wherein the signal waveform is an analog signal waveform representing a digital signal.

* * * * *